United States Patent [19]
Davis et al.

[11] Patent Number: 4,758,989
[45] Date of Patent: Jul. 19, 1988

[54] ROM HAVING BIT LINES INTERLACED WITH COLUMN LINES AND CELL COLUMN SELECTION ACCORDING TO REGULARLY INTERLACED LOGICAL FIELDS

[75] Inventors: Harold L. Davis, The Colony; Robert J. Proebsting, Argyle, both of Tex.

[73] Assignee: SGS-Thomson Microelectronics, Inc., Carrollton, Tex.

[21] Appl. No.: 119,210

[22] Filed: Nov. 5, 1987

Related U.S. Application Data

[63] Continuation of Ser. No. 686,332, Dec. 26, 1984, abandoned.

[51] Int. Cl.$^4$ .............. G11C 7/00; G11C 7/02; G06F 11/10
[52] U.S. Cl. .................. 365/189; 365/207; 365/200; 371/49
[58] Field of Search ............ 365/189, 200, 207; 371/49

[56] References Cited

U.S. PATENT DOCUMENTS

| | | | |
|---|---|---|---|
| 4,476,547 | 10/1984 | Miyasaka | 365/149 |
| 4,493,056 | 1/1985 | Mao | 365/149 |
| 4,494,220 | 1/1985 | Dumbei et al. | 365/189 |
| 4,586,171 | 4/1986 | Fujishima | 365/205 |
| 4,606,010 | 8/1986 | Saito | 365/189 |

*Primary Examiner*—Terrell W. Fears
*Assistant Examiner*—Melissa J. Koval
*Attorney, Agent, or Firm*—Roland Plottel

[57] ABSTRACT

A planar array of memory cells is controlled by row lines (word lines) for each row of cells and column lines each serving adjacent columns of cells as well as bit lines interlaced with the column lines so that all memory cells are connected between a column line and a bit line. The least significant bit of the column address provided by the column decoder selects between two sets of bit lines that are interlaced in altercation determining on which side of the column line the selected column will be found. In consequence, the selection of the column line and a set of bit lines selects only one column of cells. Enough columns of the array are selected at one time to address an entire logical field of data bits and also a set of parity bits related to the logical field of data bits. Each row of cells contain L (=16) logical fields, the individual data and parity cells of which are separated from each other by one cell of each of the other logical fields, so that a localized malfunction of the integrated circuit will not produce an error in more than one bit of any one logical field.

4 Claims, 2 Drawing Sheets

ROM HAVING BIT LINES INTERLACED WITH COLUMN LINES AND CELL COLUMN SELECTION ACCORDING TO REGULARLY INTERLACED LOGICAL FIELDS

This application is a continuation of application Ser. No. 686,332, filed Dec. 26, 1984, now abandoned.

TECHNICAL FIELD

The field of the invention is that of integrated circuit memories, in particular ROMS.

BACKGROUND ART

A common ROM configuration used in the prior art is the X-cell ROM having alternating column lines and bit lines, each column line being connected to adjacent bit lines by single-transistor memory cells that are programmed to be either very high threshold and thus permanently off or normal low threshold and conductive when their gate is high. In operation, signals from the column decoder circuit control a pull down transistor to bring a selected column line to ground and also turn on NMOS pass transistors on the adjacent bit lines, creating a current path from a bit line to ground for those transistors in the selected row that are programmed in the on state. Those bit lines having a path to ground drop in voltage from an initial precharged state, while those bit lines connected to transistors that are programmed very high threshold remain at the precharge voltage.

The voltage levels on the two bit lines adjacent to a selected column line thus indicate the data in each corresponding memory cell.

An X-cell ROM is inherently a by-2 device, since at least two bits are available, even if only one column line is selected. Since it takes power to pull down each column line, the art has made use of the by-2 feature to provide an eight-bit output by pulling down only four column lines, et cetera.

SUMMARY OF THE INVENTION

The invention relates to an X-cell ROM having neighboring cell columns belonging to respectively different interlaced logical fields. A cell is addressed by a row line, a column line and a selection between two alternately interlaced sets of bit lines, with only one connection per selected column line being established through pass transistors from one bit line to a data output terminal of a sensing device. Thus a cell belonging to one vertical stack of sets of complete horizontal logical fields, together with a bit and column lines to which that cell column is connected, is physically separated from all the other cell columns belonging to the same stack of logical fields. In between two successive columns belonging to the same stack of logical fields are cell columns respectively belonging to each of the other stacks of logical fields.

A feature of the invention is the widespread distribution of the memory cell columns that make up a logical field and their associated column and bit lines, so that a defective portion of the circuit that extends over two or more cell columns or bit lines will still result in only one error per logical field.

Another feature of the invention is the use of a set of parity cell columns, associated with each logical field, in an error-correction circuit, the parity memory cells and their associated column and bit lines for a particular logical field also being physically separated from one another.

Another feature of the invention is the use of a set of error-correction circuits, each capable of correcting a single error in a logical field, together with use of a set of logical fields that are each of sufficient size to provide efficient use of silicon area.

Another feature of the invention is the utilization of the space provided by the pitch of the column groups to provide on-pitch sense amplifiers.

BEST MODE OF CARRYING OUT THE INVENTION

In the field of large integrated circuit memories (having more than a quarter million transistors) it is common to use redundant columns (or rows) in order to improve the chip yield by compensating for defects in the circuit, since large circuits are more likely to contain a defect than small ones. As known in the art, implementation of redundancy in ROMs is extremely difficult because of the difficulty of programming data in the redundant columns or rows.

Another concern of the designers of large memories is the power dissipation of the circuit, since the density of modern circuits has made low power operation highly important.

In the case of X-cell ROMs, designers in the prior art have made multi-bit ROMs that are low power by taking advantage of the by-2 nature of the X-cell ROM to obtain an N-bit output by activating N/2 columns.

The present invention, as will be described below, relates to an X-cell ROM that employs error-correction circuitry, instead of redundant rows or columns, to improve yield, but uses more than the minimum power because the memory elements are arranged in logical fields (each field having several words), no two elements of which are adjacent, so that it is not possible to use the power-saving feature of getting two output signals per active column. The size of the logical fields is selected, as will be described below, to be large enough to be reasonably efficient in the use of silicon area.

Figure 1:
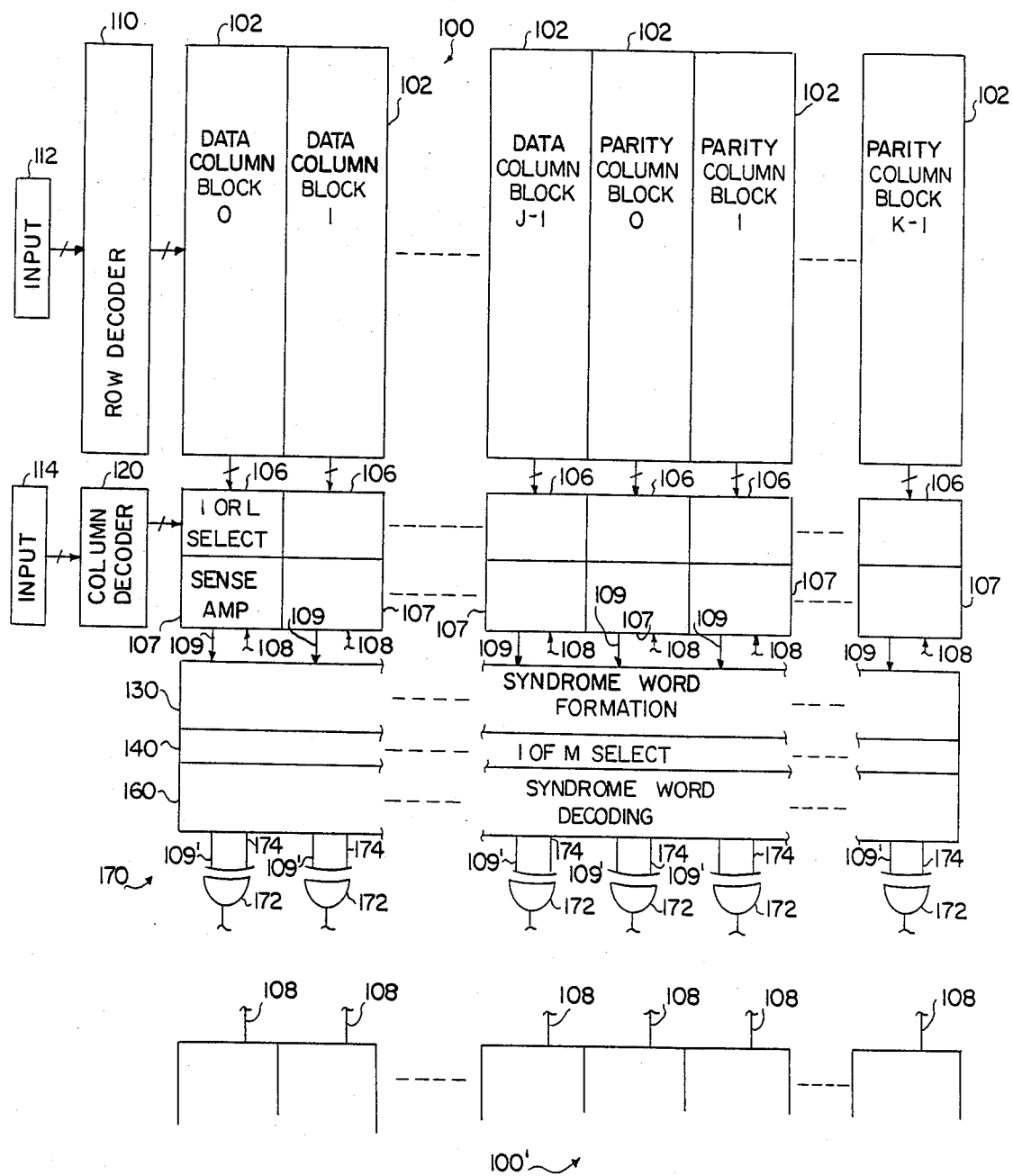
FIG. 1 illustrates in schematic form a portion of a memory constructed according to the invention.

Referring now to FIG. 1, there is illustrated schematically half a memory matrix of an embodiment of the invention. The main memory matrix, indicated by the numeral 100, is divided into J data column blocks 102 and a set of K parity column blocks 102, the contents of which will be described below. In a particular example, there are 64 data column blocks and 7 parity column blocks. In this particular example also, each column block comprises 8 column lines and 8 bit lines providing 16 (or L) progammable locations per row at the transistors placed between a column line and the adjacent bit lines using a conventional x-cell array layout.

Row decoder 110, responding to a row address from input circuit 112, energizes one of 512 word lines which travel horizontally in this figure, through column blocks 102. Column decoder 120, responding to input circuit 114, selects a set of 71 column lines in the 71 circuits 106, one column line for each data and parity column block. Each of circuits 106 selects 1 out of 16 (or L) cells, each in a separate logical field, from the corresponding column block and selected row. Each of the 71 selected bit lines connected respectively to the 71 selected cells is connected to a corresponding sense amplifier 107 which compares the voltage level on the selected bit line with a reference voltage that, in a selected embodiment, comes along line 108 from a dummy memory cell in a symmetric memory matrix 100', holding a second half of the memory cells.

FIG. 1 is schematic in nature and arbitrarily shows the parity column blocks at the right side. In an actual embodiment, they are on the right, but they may be located anywhere within the column field.

The art uses ROM memory outputs that are much less than 64 bits wide, 8 or 16 bits being common. In that case, a selected sub-field of the logical field will be selected in a second selection stage discussed below.

In the same embodiment, the bits within the 64 data elements (one from each column block) in a logical field are organized in 4 (or M) groups of 16 bits, since this architecture uses a 16-bit word-wide output. There are thus four words in each logical field in the illustrated case.

The 7 (K) parity blocks are formed on the basis of the 64-element logical fields, not on the 16-bit word, since the fraction of silicon real estate devoted to error correction decreases as the number of bits in the field being corrected increases. System considerations will influence the various tradeoffs, of course. A by-16 or by-8 output matches well with polular commercial systems. A conventional one out of four selection must be done in order to pick the 16 bits to be output. This selection is optional and the invention may be used with an output that is the full width of the logical field. There is a tradeoff on the size of the field. A large field increases the efficiency of silicon use for parity, but demands more sense amplifiers, more time for error detection and more detection circuitry. Also, since only a single error in the field can be corrected, a larger field increases the probability of two or more errors in the same field, decreasing yield.

Error correction circuitry is well known in the art. The Hamming code method corrects for a single error at any location in the logical field by a series of parity checks combining the output data and the stored parity bits to derive a K bit error correction pointer word that is referred to in the art as the syndrome word. A reference for the logical operations to form a syndrome word according to the Hamming method is: Hamming, R. W. *Error Detecting and Correcting Codes* Bell System Technical Journal, Vol. 29, pp. 147-160, April, 1950. An optional method of error correction that uses a sydrome word of size K-1 and will not correct an error in one of the data elements is disclosed in co-pending U.S. patent applications Ser. Nos. 688,333 and 686,331, both filed Dec. 26, 1984, assigned to the assignee hereof and incorporated herein. This invention may be used with either error correction method. Other error correction methods capable of correcting two or more errors are known in the art and may also be used. The syndrome word is formed from the data and parity bits in circuit 130.

It is convenient to perform the optional 1 out of 4 selection on the data signals on lines 109 that pass through circuit 130 at the location (circuit 140) indicated in the figure, between the syndrome word formation circuit 130 and the syndrome word decoding circuit 160. All of circuits 130, 140 and 160 will be evident to those skilled in the art in the light of either method of error correction. The syndrome word decoding step, as is explained in the references above, is initiated if there is an error. If there is no error, then ciruict 130 will generate a signal that inhibits error correction. When an error is present, using the correction technique described in the above-referenced patent applications, it is necessary to determine if the error is in the 16-bit subfield that is to be output, for if the error is in one of the 48 remaining bits, then no error inversion will be necessary. If the above two criteria are met, then a logical one is placed on the correct line 174 leading to one of exclusive-OR circuits 172 and the bit on data line 109', which is the selected one of a set of four data lines 109, will be inverted in circuit 172. If the signal on line 174 is a logical zero, then the data will pass through circuit 172 uninverted. The error inversion means 170 is the assemblage of 16 (or the desired number L) of exclusive-OR circuits 172.

It should be stressed that the advantages of logical field interlacing ("interdigitation") and the selection of one out of L logical fields are present regardless of the type of error correction circuitry. The system referred to in the co-pending application was used as a result of a tradeoff in which its simplicity of layout overcame the disadvantage of incomplete error correction, but it may not be the best mode for all applications of this invention.

Figure 2:
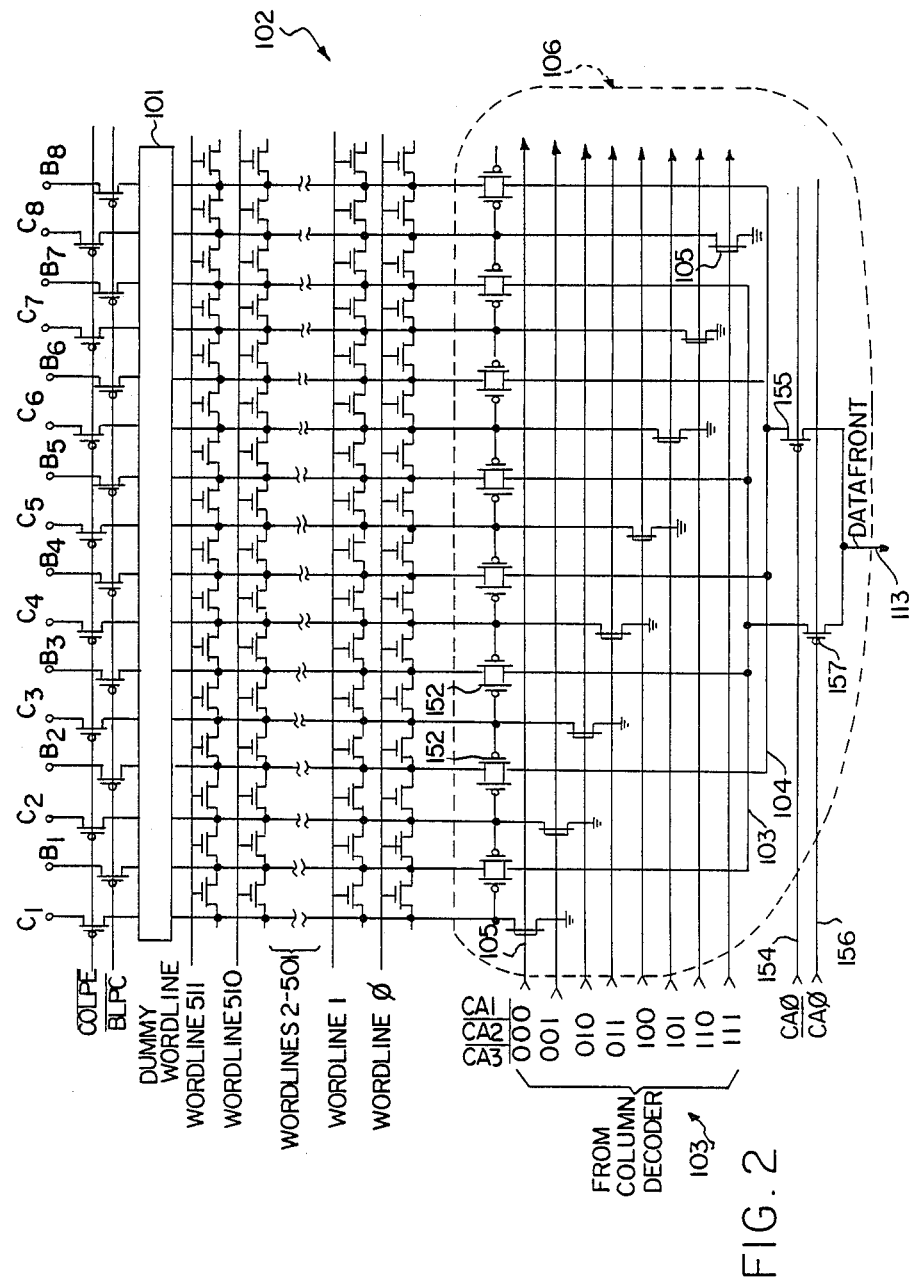
FIG. 2 illustrates schematically a segment of a memory matrix in the circuit of FIG. 1.

Referring now to FIG. 2, there is shown in some detail the contents of one of column blocks 102 and selection circuits 106. The arrangement of column lines and bit lines within a block 102 is indicated at the top of FIG. 2, in which the first vertical line is column line 1, followed consecutively by bit line 1, column line 2, bit line 2, etc. All of the 8 column lines and 8 bit lines are connected to VCC by pull up transistors that are controlled by separate signals in this embodiment. During a set up period all the column lines and bit lines are precharged to VCC by means of the pull up transistors. In this embodiment, the pull up transistors are P-channel transistors, as this is a CMOS circuit.

Below the pull up transistors, there is a block indicated by the numeral 101 that contains a dummy word line that is used to provide a voltage reference for a sense amplifier. The memory block 100 shown in FIG. 1 comprises half the total memory array. For reasons of symmetry, a data signal from block 100 will be compared with a dummy data signal on line 108 generated by the dummy word line in the counterpart block 100'. If a word line from the counterpart block 100' had been selected, then the dummy word line 101 in block 100 would have been selected.

Below the dummy word line, there is the memory matrix comprising, in this embodiment, 512 rows of programmed transistors. As can be seen in FIG. 1, there are 64 column blocks (excluding parity columns) containing 16 cell columns each so that there are 1024 columns and 512 rows, and the total number of data bits stored in each half-memory is one half megabit.

Below the bottom word line, circuit 106 performs the functions of selecting the correct column line and also establishing connection between the proper (left or right) adjacent bit line and the sense amp, circuit 107. A set of 8 column decode lines, indicated by the numeral 103 and separately indicated by a 3 bit binary address (that are bits 1 to 3 of the column address) enters from column decoder 120. Each of the 8 column decode lines controls the gate of a transistor 105 connected to one of the 8 column lines. All the 8 column decode lines pass on from circuit 106 on to the next circuit 106 and so on all the way across the memory matrix.

In operation, a particular column, say column $C_3$ indicated by 010, has its pull down transistor 105 turned on, thereby pulling down that column line to ground. The drop in voltage of the column line turns on the two P-channel pass transistors 152 on adjacent bit lines of the column line in question ($B_2$ and $B_3$). Since each column line turns on two bit lines, each bit line has two P-channel pass transistors connected to adjacent column lines. Thus, whenever a column line is selected, two bit lines will be connected between the memory matrix and circuit 106. In prior art ROMS, it is conventional to use these two signals at the same time, so as to avoid taking any more column lines low than is necessary, to save power. In this case, however, one of these two potentially available signals will specifically not be used, contrary to the practice in the prior art. The 8 bit lines can be seen as being connected in two groups that are connected to horizontal lines 103 and 104 respectively. One of these two groups of lines is selected by a signal on horizontal lines 154 and the other group of lines is selected by a signal on horizontal line 156. Lines 154 qnd 156 are the zeroth (least significant) bit of the column address and its complement respectively. Since only one of the four bit lines in groups 103 or 104 will be selected at any one time, and, since only one of the lines 103 or 104 will be selected at that time, only one connection will be made from a bit line through P-channel pass transistors 152 and 155 of 157 controlled by the least significant bit of the column address (CA0 and its complement) to the data out terminal 113 that is one input to the sense amplifier.

The schematic illustrated is referred to in the field as an X-cell ROM because the contacts to both the metal column line and to the metal bit line are shared by four memory cells and take the shape of the letter X. This configuration gives rise to transistors between each column line and its two adjoining bit lines, making for a very dense layout. It is not necessary for the practice of this invention that this particular shared contact feature be used and layout that is positioned like the schematic of FIG. 2 may also be used.

The difference from the prior art practice on this point is that a ROM having alternating bit and column lines is inherently by-2 and those skilled in the art would ordinarily make use of the two signals that are available on adjacent bit lines. By so doing, 16 bits could be accessed by pulling down 8 column lines, so that active power could be reduced; the capacitance on the column decode lines may be reduced, etc. In contrast, with this invention 71 column lines (64 data and 7 parity) must be pulled down for a 16 bit output, with an attendant increase in active power.

The foregoing geometrical arrangement of the column lines and bit lines has two advantages that are immediately apparent. A simple advantage used for layout purposes is that the horizontal space occupied by 16 lines is now available for other circuits, such as sense amplifier 107, which take up more silicon real estate width than that of the small transistors between bit lines and column lines within the memory matrix. It would obviously be extremely difficult to put a sense amplifier or other detection circuit on the bit line to column line pitch to detect the output signal from a memory cell. The second difference, which is closely connected with the error correction circuitry, is that since only one out of 16 memory cell transistors is accessed within this column block, the data are organized into 16 logically separate but physically overlapping fields. The normally used for this geometrical arrangement is "interdigitated" but because that term etymologically connotes fingers solidary to a "hand," the equivalent term "interlaced", which is commonly used now for interfitting arrays of straight lines in other contexts, is used here. As was discussed above, this would be a drawback in the prior art because it is very simple and efficient to turn on all the required bit lines (8, 16, or any other number) at the same time and to pull out all the available data at the same time.

When error correction circuitry is used, however, there is an advantage in this scheme of things that is not readily apparent. If there is a defect in the substrate, a short circuit, or any other source of error, it may obliterate two or more (up to 16) adjacent memory cells on a row line within this block (and perhaps more than one row line) and still cause only one error in each of the 16 different logical fields since bits from a given logical field are separated by 15 bits from other logical fields. This is important because, as was discussed above, the standard methods of error correction that can be reasonably implemented are able to correct at most one error within the data. Thus, the 64 data columns each comprise one set of data to be error corrected that will be divided into 4 output fields of 16 bits each. Each 64-bit field has a corresponding set of 7 parity bits, as is known in the art of error correction. With the interlacing of logical fields by sequential ordering, it would be possible for a complete column block; the corresponding selection circuit 106; or the corresponding sense amplifier 107 to be defective and for the circuit to still function perfectly by means of the error correction.

As was discussed above, in this embodiment there is a word-wide output of 16 bits, selected from the 64 bits entering circuit 130 so that a one out of 4 selection is done in circuit 140. Two "address" or column-locating bits will be needed as input to circuit 140 to flag the proper output subset (in addition to the 4 bits used in circuits 106). If the output were an 8 bit word, then three bits would be needed to specify a 1 out of 8 selection, etc. Advantageously, circuits 140 can include a programmable or pin selectable option of output word size, to make the circuit readily adaptable to different system requirements. This programming would be done simultaneously with the ROM data.

The spreading out of the cells in a field may conveniently be done in a regular fashion by having a first cell in a first field followed by N-1 first cells in N-1 following fields for a total of N fields. Thus, each cell in a field will be separated physically by N-1 other cells, so that the N fields are interlaced, with a regular pattern of succession of cells in sequence. Conveniently, the column lines will be in groups of N/2, since only one of N cells will be selected on each read sequence. There is thus a saving in sense amplifiers and syndrome word decoding circuits since all the fields can share these overhead circuits. There is (perhaps) some waste in that 64 data bits (plus 7 parity bits) must be read out and passed through the set of 71 sense amplifiers plus the correction circuitry to obtain 16 bits of output, but the overall system efficiency and silicon efficiency is better for this embodiment than for an embodiment that used a set of 16-bit fields and thus required only 16 (plus 5 parity) sense amplifiers, since this would require 21 bits of total data storage for each 16-bit output (5 extra parity bits) while the disclosed scheme uses only 7 extra parity bits per 64 bits of data.

It should be noted, for clear understanding of the terminology of this application, that a logical data field is a spaced-apart set of cells all in the same row, that the selection of sets of column lines and of multiple subsets of bit lines, serves to select cells of respective selected cell columns that in turn are a set of a spaced apart set of cell columns that can be regarded as columnar stacks of complete horizontal logical fields of cells, one field in each row. Thus selection of a set of cell columns and also of a row of cells selects one logical field of data cells and the parity information storage cells oif the same logical field. Selection of a set of cell columns is a 1 out of L selection (1 out of 16 in a illustrated case) and the L selectable sets of cell columns are interlaced, so that between two selected columns of one selected set of columns there is one unselected column of each of the unselected sets of columns.

Although from a circuit point of view it is common to refer to selected column lines (more properly, selected sets of column lines) and selected bit lines (more properly, selected sets of subsets of bit lines) less confusion is produced, especially in connection with the concept of logical fields, when the subject matter of the invention is referred to in terms of selected cell columns, and selected and selectable sets of cell columns.

What is claimed is:

1. An integrated circuit read-only memory having:
   an array of memory cells arranged in a multiplicity of rows and columns;
   a multiplicity of row lines for access to the respective rows of said memory cells;
   a multiplicity of column lines orthogonal to said row lines and a multiplicity of bit lines orthogonal to said row lines, said column and bit lines being interlaced in alternation for access to said memory cell columns, adjacent column lines being separated by a pair of said memory cell columns, each said pair of columns of memory cells separating two adjacent column lines being connected to and served by a common bit line passing between the memory cell columns of the pair, the adjacent memory cell columns of adjacent pairs thereof being connected to a common column line passing between them, the memory cells of each memory cell column being connected between a said bit line and a said column line, and each of the memory cells of a said memory cell row being controlled by one of said row lines whereby selection of a row line enables the memory cells controlled by that row line;
   means for selecting a row line;
   a plurality of sense amplifiers each serving a group of said columns of said memory cells for amplification of a signal placed on a said bit line by an enabled memory cell;
   means for selecting a plurality of column lines respectively located in groups served by different sense amplifiers and which are separated from each other by at least one unselected column line and therefore by at least four columns of said memory cells, whereby first and second sets of said memory cells, which cells are enabled by said selected row line and which sets are respectively located on first and second sides of each said selected column lines and respectively connected to first and second sets of bit lines likewise respectively located on first and second sides of each of said selected column lines, place first and second data signals respectively on said first and second sets of bit lines, each cell of said first set placing one of said first data signals on a said bit line of said first set and each cell of said second set placing one of said second data signals on a said bit line of said second set; and
   data selection means, responsive to a selection signal, for selecting only one of each pair of first and second data signals by selecting between said first and second sets of bit lines, whereby only one data signal is selected for each selected column line for being furnished to a sense amplifier.

2. An integrated circuit memory according to claim 1, in which said means for selecting said plurality of column lines includes column decoder means responsive to a first input signal for selecting simultaneously all of a first set of column lines that are separated from each other by at least one unselected column line, from among a plurality of interlaced sets of equal numbers of column lines similarly disposed, for access through said first set of selected column lines to a first logical field of memory cells defined by said selected row line, by said first set of selected column lines and by bit lines of sets of bit lines selected by said selection signal of said data selection means and having the property that each memory cell of said first logical field is separated from the nearest other memory cell of the same logical field by a cell of each other selectable logical fields of cells in the same row, and in which each said sense amplifier is selectably shared by a group of cell columns constituted of one column of memory cells out of each of the interlaced columnar cell stack sets which are selectable, each selectable columnar cell stack thereby defining a columnar set of complete logical fields of memory cells of which each field is in a different row, the separate logical fields being defined in each case by intersections of a spaced set of cell columns and a row line, said spaced sets of cell columns defining the several logical fields accessible by the same row line, being interlaced in ordered sequence.

3. An integrated circuit according to claim 2, further comprising, for each columnar set of logical fields of memory cells, a columnar set of parity information memory cells selectable by additional column lines and bit lines at the same time as the corresponding columnar set of logical fields is selected, the individual parity information memory cells corresponding to a particular logical field being selected by the same selection of a row line that contributes to defining the particular logical field selected from a columnar set; and
   error correcting means, responsive to data stored in the simultaneously selected logical field and corresponding parity memory cells for generating an error pointer signal indicative of the presence and location of a data error in the selected logical field.

4. An integrated circuit according to claim 2, wherein said array of memory cells, in addition to including memory cells in rows and columns containing only data memory cells, also includes a plurality of additional columns of cells for storage of parity information for each logical field of data memory cells, said parity information storage cells being addressable by continuation of said row lines and by additional column and bit lines, with interlacing of logical fields in the same manner as in the case of said data memory cells, whereby the addressing of the data memory cells of each logical field also addresses parity information storge cells related to the data contained in the data memory cells of the addressed logical fields and produces only one parity information signal for each selected additional column line for being furnished to a sense amplifier which is shared by one selectable column of parity information storage cells out of each of the interlaced columnar parity cell stack sets respectively serving different logical fields in every said row of cells, the sense amlifiers serving the parity information storage cells being provided for furnishing parity information signals to error detection and processing means.

* * * * *